(12) United States Patent
Olson

(10) Patent No.: US 7,078,305 B2
(45) Date of Patent: *Jul. 18, 2006

(54) HIGH VALUE SPLIT POLY P-RESISTOR WITH LOW STANDARD DEVIATION

(75) Inventor: James Michael Olson, Yarmouth, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/018,041

(22) Filed: Dec. 21, 2004

(65) Prior Publication Data

US 2005/0106805 A1 May 19, 2005

Related U.S. Application Data

(62) Division of application No. 10/355,317, filed on Jan. 31, 2003, now Pat. No. 6,885,280.

(51) Int. Cl.
*H01L 21/00* (2006.01)

(52) U.S. Cl. .................................... 438/382; 438/384

(58) Field of Classification Search ......... 438/382–385
See application file for complete search history.

(56) References Cited

U.S. PATENT DOCUMENTS

| 4,528,582 | A | 7/1985 | Cohen et al. |
| 4,785,342 | A | 11/1988 | Yamanaka et al. |
| 5,793,097 | A | 8/1998 | Shimamoto et al. |
| 5,959,343 | A | 9/1999 | Harada et al. |
| 6,054,359 | A | 4/2000 | Tsui et al. |
| 6,211,031 | B1 | 4/2001 | Lin et al. |
| 6,603,172 | B1 * | 8/2003 | Segawa et al. ............. 257/328 |
| 6,700,474 | B1 * | 3/2004 | Leibiger ..................... 338/309 |

* cited by examiner

*Primary Examiner*—H. Jey Tsai
(74) *Attorney, Agent, or Firm*—Cesari and McKenna, LLP; Edwin H. Paul, Esq.

(57) ABSTRACT

A resistor structure is disclosed that is constructed out of two layers of polysilicon. The intrinsic device is made using the top layer which is either a dedicated deposition, or formed as part of an existing process step such as a base epi growth in a BiCMOS flow. This poly layer can be made with a relatively high (greater than 2000 ohms per square) sheet resistance by appropriate scaling of the implant dose or by insitu doping methods. In this invention this layer is arranged to be about 1000 A or less thick. Such a resistor form with this thickness has been shown to demonstrate a better standard deviation of resistance compared to resistors made with a thicker layer. Additionally, practical resistors made in elongated forms demonstrate better standard deviations of resistance when five bends were incorporated into the form. The resistor ends are formed by the addition of a bottom poly layer in a self aligned manner with a deposition that may already be part of the process sequence. The end result is that the intrinsic resistor body is formed of a single poly layer, while the ends are created out of two layers. These ends are thick enough so that standard silicide and contact etch processing may be added to the structure without special care. In addition, dedicated or already available implants may be incorporated into the resistor ends to ensure ohmic contacts from polysilicon to the silicide or the contact metal are achieved. These steps can produce an easily fabricated resistor structure with consistent, low resistance, ohmic end contacts, and intrinsic resistance of greater than 2000 ohms per square.

11 Claims, 8 Drawing Sheets

HIGH VALUE SPLIT POLY P-RESISTOR WITH LOW STANDARD DEVIATION

CROSS REFERENCE TO RELATED APPLICATIONS

The present application is a divisional of commonly assigned, allowed U.S. patent application Ser. No. 10/355,317, which was filed on Jan. 31, 2003, now U.S. Pat. No. 6,885,280 of common title and inventorship with the present invention, and which is hereby incorporated by reference. Priority is claimed from this application.

This application is also related to a patent entitled High Value Polysilicon Resistor, by Steven M. Leibiger, U.S. Pat. No. 6,700,474, which was issued on Mar. 2, 2004, and commonly owned with the present application. This patent of Mr. Leibiger is hereby incorporated herein by reference.

BACKGROUND OF THE INVENTION

1. Field of the Invention

The present invention relates to a structure and process for forming polysilicon resistors on semiconductor substrates, and more particularly to dual layer polysilicon high value resistor structures.

2. Background Information

Forming high value polysilicon resistors on the same wafer together with other circuit components can be difficult. One reason is that the thickness of the polysilicon layer or layers is determined by the required characteristics of the other devices. For example, the deposited polysilicon must also form the gates and/or emitters of active components, lower value resistors and capacitor plates. This requires thicknesses that are typically greater than 200 nanometers (nm).

As illustrated in FIG. 1, polysilicon resistivity is a non-linear function of doping where the resistivity decreases quickly as the doping concentration increases. Implant dopant concentration control makes resistivity greater than about 0.060 ohm-cm difficult to achieve. Since, as the doping concentration is reduced (compare point a to point b in FIG. 1), the rate of change of resistivity with doping concentrations increases dramatically making control of resistivity and thus resistance difficult. These two restrictions limit practical sheet resistances to not much above 2000 ohms/square. Therefore, mega-ohm resistors will consume much space and will greatly increase die size.

Attempts to form high value polysilicon resistors have used ion implants and reduced polysilicon thicknesses with limited success. Other structures have used multiple layers of polysilicon. But, these often require many additional steps and processes beyond those needed for the core devices on the same wafer, and the resulting resistors have device and process control limitations.

One such attempt is described in U.S. Pat. No. 6,211,031 to Dah-Chih Lin et al. This invention describes a split or dual value polysilicon process using two layers. A first layer is deposited and patterned to expose the underlying dielectric substrate. A second polysilicon layer is deposited over the first layer and the dielectric. Dual parallel resistors are formed. If the polysilicon resistivity is too high, the resistor end contact structures will form rectifying contacts. There is no suggestion or disclosure of processing to provide low ohmic end structures. The process of etching a contact hole that terminates on but does not go through the thin poly layer is also difficult.

Another approach is found in U.S. Pat. No. 6,054,359 to Yu-Ming Tsui et al. This patent describes a thin polysilicon layer with a thicker polysilicon layer overlaying the thinner layer. The thin layer is doped in place and the thicker layer is undoped. The combination of the two layers forms the resistor. This particular invention suffers especially from the undoped layer forming part of the end structures of the resistors being formed. The result is relatively high ohmic end contacts for the resistors.

Prior art does not address the technical problems of integrating silicide or metal contacts into thin polysilicon resistors. In the case of silicide, the forming reaction will consume much if not all of a thin poly layer. For contact etch, the required over-reach can completely burrow through the poly. Each of the above can make the resistor nonfunctional or unreliable. For these reasons, prior art techniques often are forced to accept high impedance end structures or even non-ohmic connections.

Therefore, a need remains to provide high value polysilicon integrated circuit resistors having existing process compatibility; with few, if any, added process steps; and with well controlled resistor end structures having relatively low ohmic resistances to the metalization layer.

SUMMARY OF THE INVENTION

An objective of the present invention is to provide a high value polysilicon resistor requiring an additional single mask step to a typical CMOS, bipolar or BiCMOS process flow. Another objective is to improve the control of the resistor value while increasing the polysilicon resistance, in a particular instance, by more than an order of magnitude.

In the above referenced related application of Mr. Steven Leibiger a relatively thick layer of polysilicon is deposited on a field oxide formed on a silicon substrate. This relatively thick layer ultimately can be used to form the ends of a higher value resistor and with a second polysilicon layer can be used to form gates, emitters, lower value resistors and capacitor plates.

In the Leibiger application a second objective of the invention is construction of the high value resistor out of two separately deposited polysilicon layers in such a way that the intrinsic resistor is formed from only one layer, while the resistor ends are formed from two self-aligned stacked layers. This allows the intrinsic resistor to be thinner and more lightly doped to achieve a high sheet resistance value (greater than 2000 ohms per square), while the end polysilicon stack can be thick enough to easily withstand normal processing such as contact etch, silicide formation, or other existing steps. The ends can also be implanted or otherwise doped heavier than the resistor body so that ohmic connections between the poly and the silicide or contact material can be achieved.

It was found that a reduction in the thickness of the second polysilicon layer, that primarily determines the resistor value in the Leibeiger application, to less than 1000 Angstroms increase the resistance as might be expected, but the thinner layer also significantly reduced the standard deviation of the of the resistance itself. It has also been found that reducing the width of the second layer increased the resistance, as expected, but also increased the standard deviation of the resistance. However, even with a reduced width of the second layer, the thinner thickness still reduced the standard deviation of the resistances.

The reason for the reduction in variation realized for thinner polysilicon resistors is related to a balance of geometry and material properties. The resistance of polysilicon resistors is dictated by $$R=(\rho*L)/A \qquad \text{Equ. 1}$$

where R is the resistance of the structure, $\rho$ is the resistivity (a material property), L is the length of the resistor and A is the cross-sectional area of the resistor. The cross-sectional area (A) is the product of the thickness and width of the resistor. As discussed above, the resistivity of the structure may be increased by changing the dopant concentration. However, as the doping concentration is reduced, the rate of change in resistivity with doping concentration increases dramatically making control of resistivity (and thus resistance) difficult. By reducing the thickness of the structure, the resistance may be increased independently of dopant concentration (reduction in A of Equation 1 above). For identical implant dose, thin POLY has a higher doping concentration (dopant species/unit volume). As such, the resistivity of the layer is lower than thicker POLY. Structures created from this lower resistivity material have much less variation due to the reduced slope in resistivity (FIG. 1) and due to the fact that concentration driven diffusion between the resistor body and the ends is reduced.

It will be appreciated by those skilled in the art that although the following detailed description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

DETAILED DESCRIPTION OF AN ILLUSTRATIVE EMBODIMENT

High value resistors with surface resistivities between 2K ohms/square and 23K ohms/square was built in accordance with the Leibiger application. Some were built with a poly layer that determines the resistivity, see the following discussion, of a thickness of 3700 Angstroms (A). and others were built with the layer thickness of 1000 A. The thicker polysilicon leg was a 300 A a-Si, and a 3400 A polysilicon comprising a 3700 A thickness.

Another anomaly was observed for resistors with either the 1000 A or the 3700 A layers. If resistors were formed of 50 squares formed with a width of 2 micrometers and a length of 100 micrometers, resistors with five bends had consistently lower standard deviations of resistances compared to identical resistors having no bends or ten bends.

12K ohm/square resistors were built with the 1000 A layer that demonstrated and standard deviation of surface resistance of about 4%. In contrast 6K ohm/square resistors made identically except with the 3700 A layer had standard deviations ranging from 11% to as much as 43%. Resistors on the order of 1 M ohm had +/−5% standard deviations with the 1000 A layer compared to +/−121% for 0.3 M ohm resistors having the 3700 A layer. These resistors were of the same form factor discussed above (2×100 micrometers) with no bends.

The 12K ohm resistors with the 1000 A layer had temperature coefficients of resistance (TCR) of −2700 ppm. However, the rate of change with increasing resistance is lower with the 1000 A layer as compared to the 3700 A layer.

Figure 2:
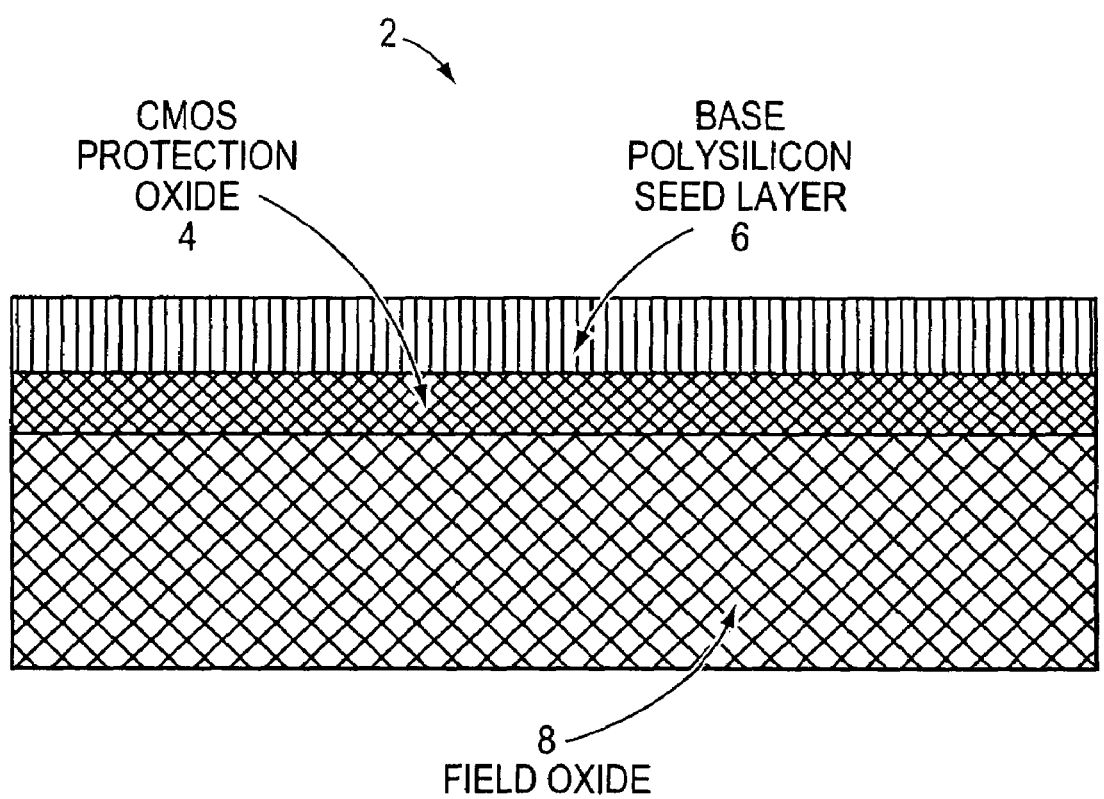
FIG. 2 is a cross section showing a region of a wafer covered with a layer stack, the top layer of which is polysilicon.

FIG. 2 shows a stack 2 from a process flow comprising an isolation field oxide 4 and a deposited polysilicon layer 6 on top of the field oxide 8. Although not the case in the FIG. 2, there may be more than one layer of oxide under the polysilicon. This polysilicon layer will be the bottom part of the final end contact structures of the high value resistors being formed, and this layer may also be used elsewhere in other structures such as for the gates of CMOS transistors or the emitters of NPN transistors. It is also possible to form this layer as part of an epi deposition.

Figure 3:
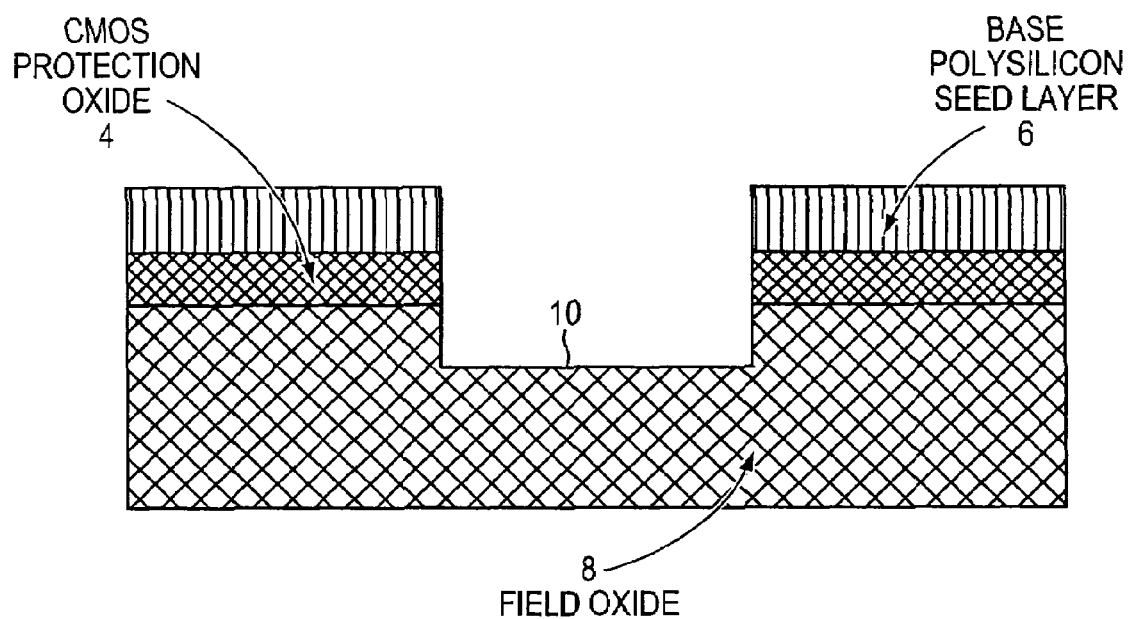
FIG. 3 is the structure of FIG. 1 where the polysilicon is etched exposing the underlying field oxide.

FIG. 3 shows the structure of FIG. 2 etched or patterned to expose the underlying oxide layer 10. This patterning includes masking parts of the structure with photoresist, photographically exposing part of the photoresist and then etching away the unprotected polysilicon areas. Such materials and photo-processes (e.g. step and repeat, etc.) are well known in the art. It is possible that this etching process in this step is otherwise used in the process flow, or it may be dedicated to the high value resistor formation only. For example, it may be the same process sequence that will open the bipolar device active regions to allow epi growth on the single crystal base regions. In that case, no additional processing is required.

Figure 4:
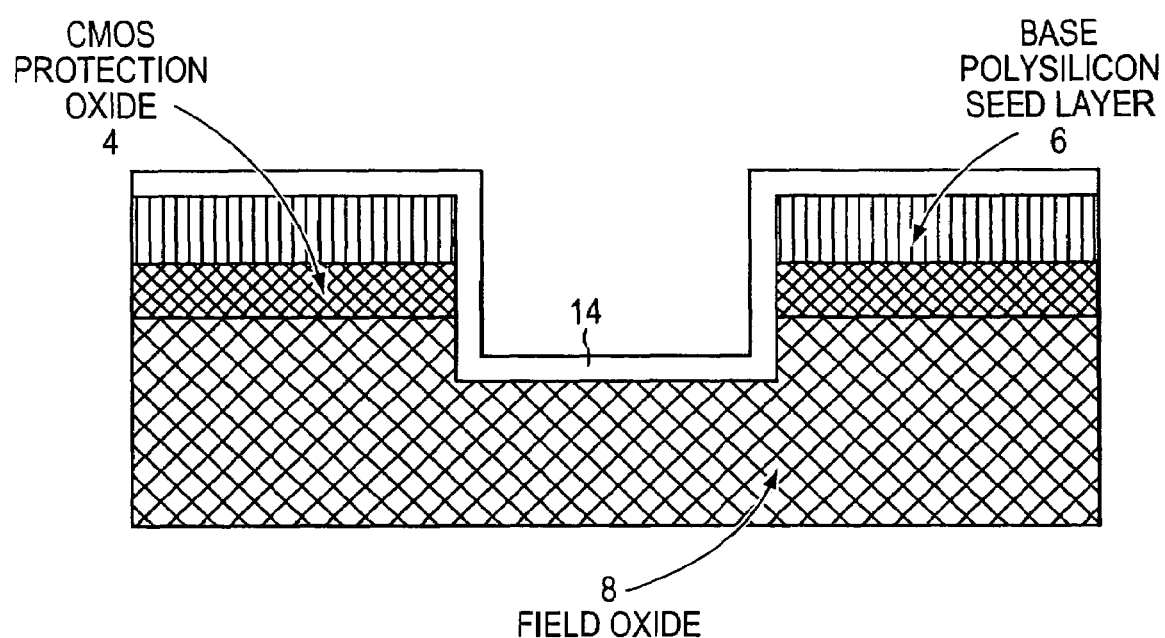
FIG. 4 is the structure from FIG. 3 with a second layer of polysilicon is deposited on the stack. This layer may or may not be doped using insitu or ion implant techniques.

FIG. 4 shows the structure of FIG. 3 after the deposition of the top polysilicon layer 14. Notice that this layer covers the horizontal and vertical surfaces of the first polysilicon layer as well as all of the exposed oxide. This second poly layer may be significantly thinner than the first layer and when at a thickness of 1000 A or less demonstrates the unexpected improved standard deviation, discussed above, of resistance of the resulting resistor. It may be deposited in a standard polysilicon system, or may be put down as part of an epi growth step. Germanium may or may not be used during this processing sequence. If the second layer is not insitu doped during the deposition process, this second polysilicon layer can be doped with an ion implant step. The implant may be selectively applied or may be blanketed over the entire wafer. Blanketing would require no patterning. Regardless of the doping methods, the thickness and impurity concentrations will be such that the final sheet resistance of the second polysilicon layer will be in excess of 2000 ohms per square.

Figure 5:
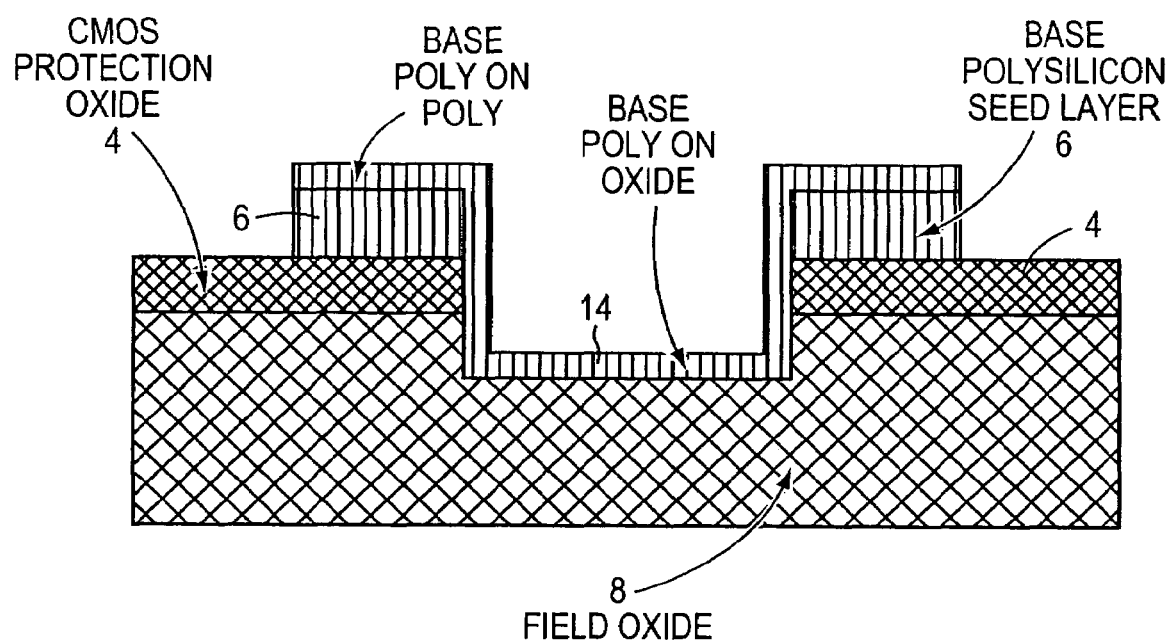
FIG. 5 shows the structure of FIG. 4 that has both layers of polysilicon etched and patterned.
Figure 6:
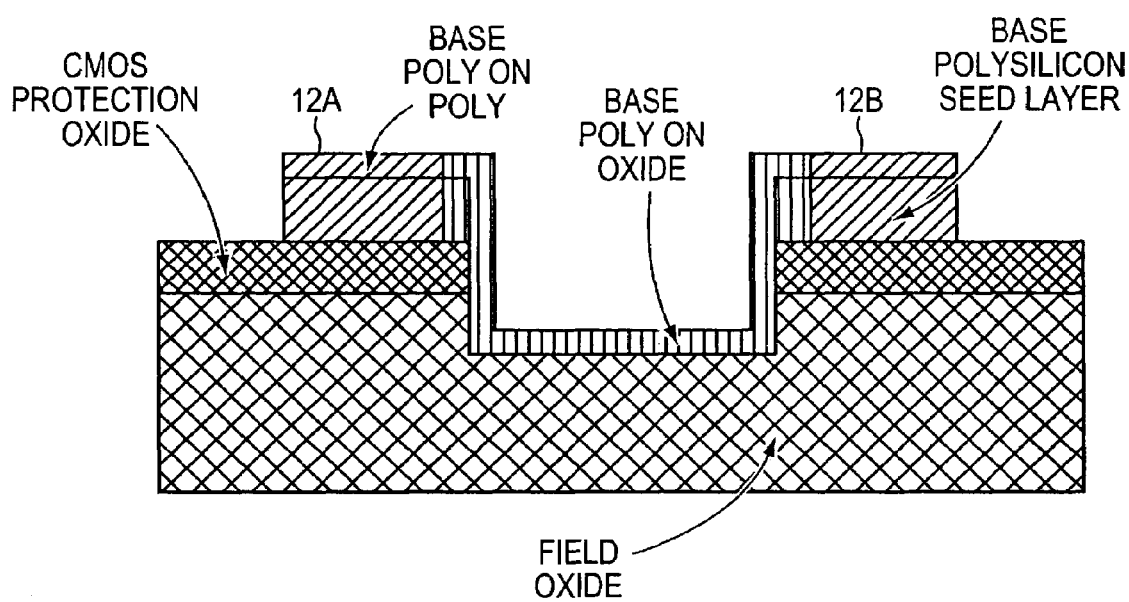
FIG. 6 is the structure of FIG. 5 with the end contacts of the resistor selectively implanted or otherwise doped.

The structure of FIG. 4 is masked and patterned as shown in FIG. 5. The polysilicon definition and etch steps used here are existing parts of the process flow even if the resistor is not used, so there is no extra complexity. The two poly resistor ends and the single poly intrinsic resistor 14 can be seen in FIG. 5. The end structures that will be the contact points for the resistor are shown in FIG. 6 after the end structures 12A and 12B have been masked and implanted with a higher dose of the same n or p type material that was used earlier in the process. This implant step may not be required, and also may be identical to existing process steps such as the CMOS source and drain implant.

Figure 7:
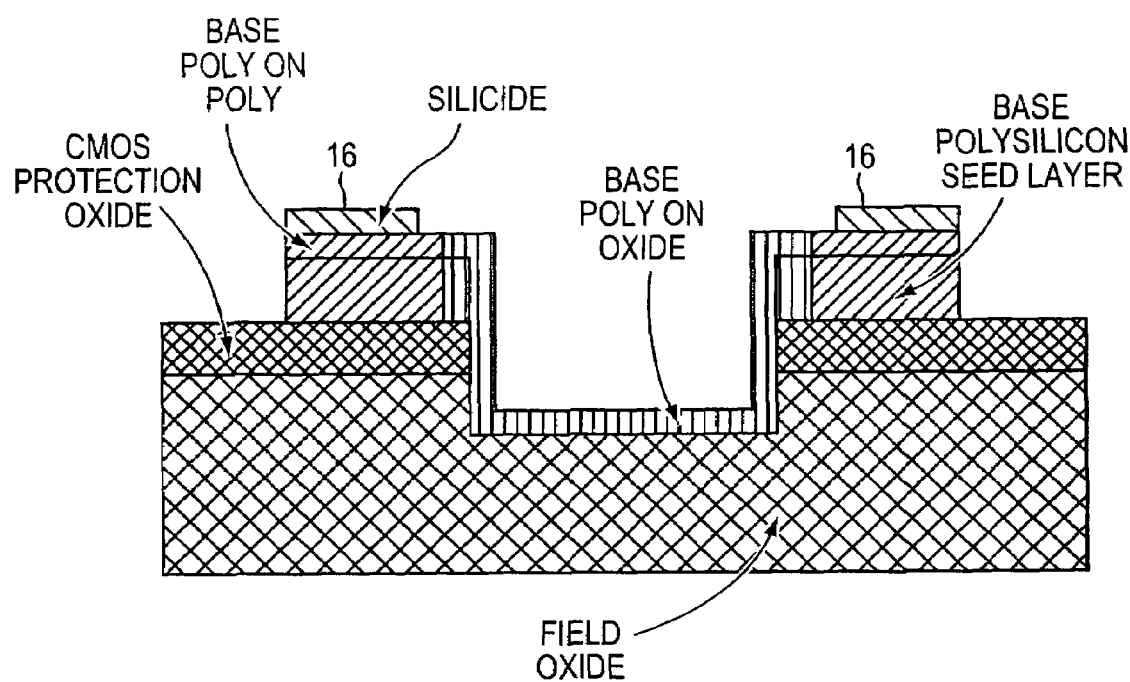
FIG. 7 is the structure of FIG. 6 where silicide layers have been formed on the dual polysilicon end structures.

FIG. 7 shows selectively patterned silicide layers 16 and 17 which may be formed on the resistor end structures. The silicide layer is optional and may overlay the entire dual polysilicon layers, or only part as shown. Importantly, if used the silicide layer is built on relatively (compared to prior art) thicker double layer of poly. This obviates the problems associated with a silicide layer directly on a thin poly layer. This silicide layer may be made using titanium, tungsten, cobalt, platinum or other metals using methods well understood by those familiar with silicon processing technology.

Figure 8:
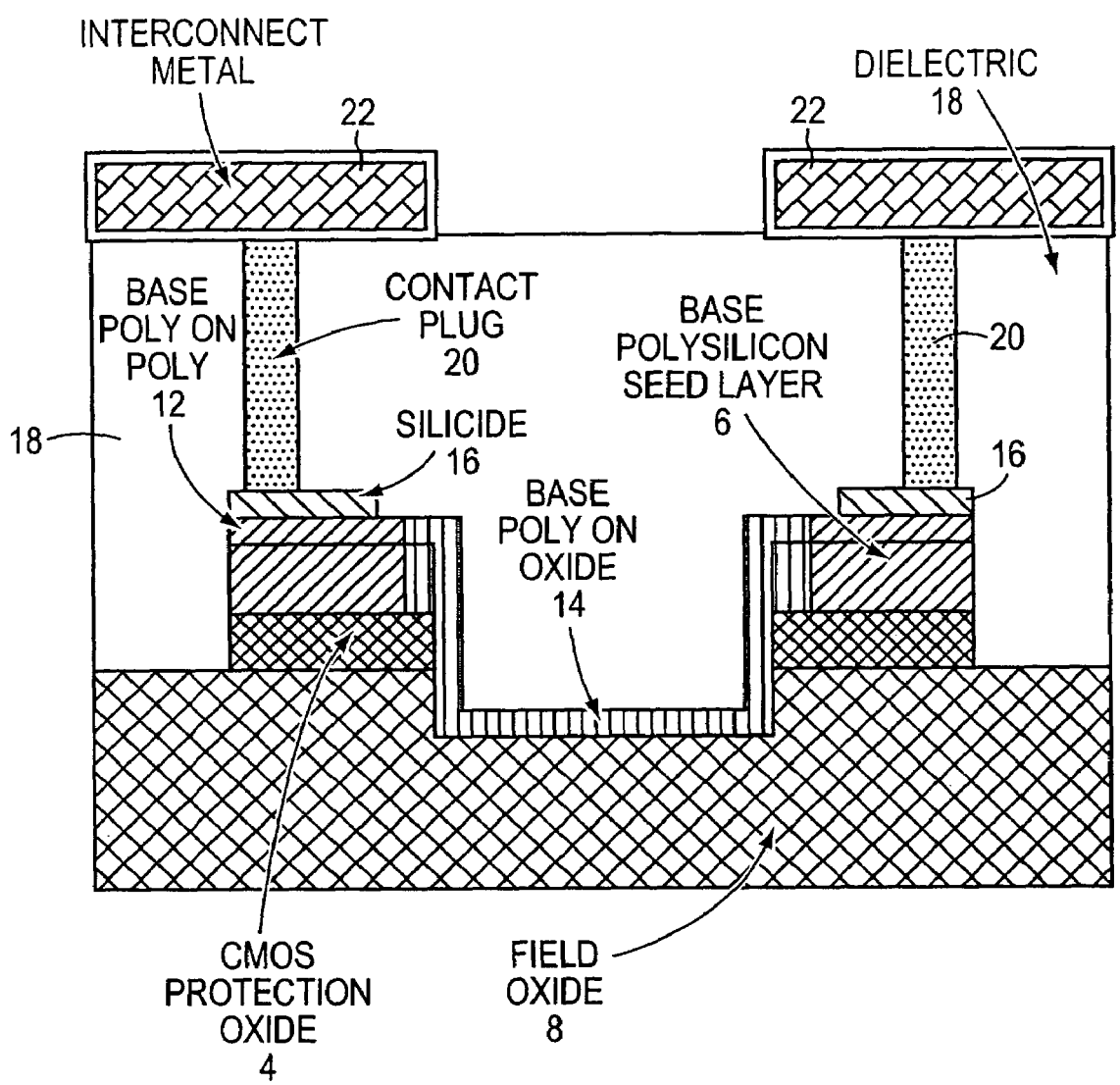
FIG. 8 is the structures of FIG. 7 where a dielectric and metal connections have been applied to form the final resistor.

FIG. 8 shows the complete resistor structures with the dielectric insulator layer 18 and the selectively placed metalized wells 20 interconnecting the resistor ends to the metalization 22 interconnecting to the rest of the chip circuitry. Note that the contacts are etched over the dual polysilicon resistor ends, rather than the single polysilicon intrinsic resistor. This allows the existing contact etch process steps to be used on this structure without modification and with sufficient process margin. The wells may be filled with tungsten, copper, aluminum or titanium or combinations thereof or other such metals as are known in the art.

Figure 1:
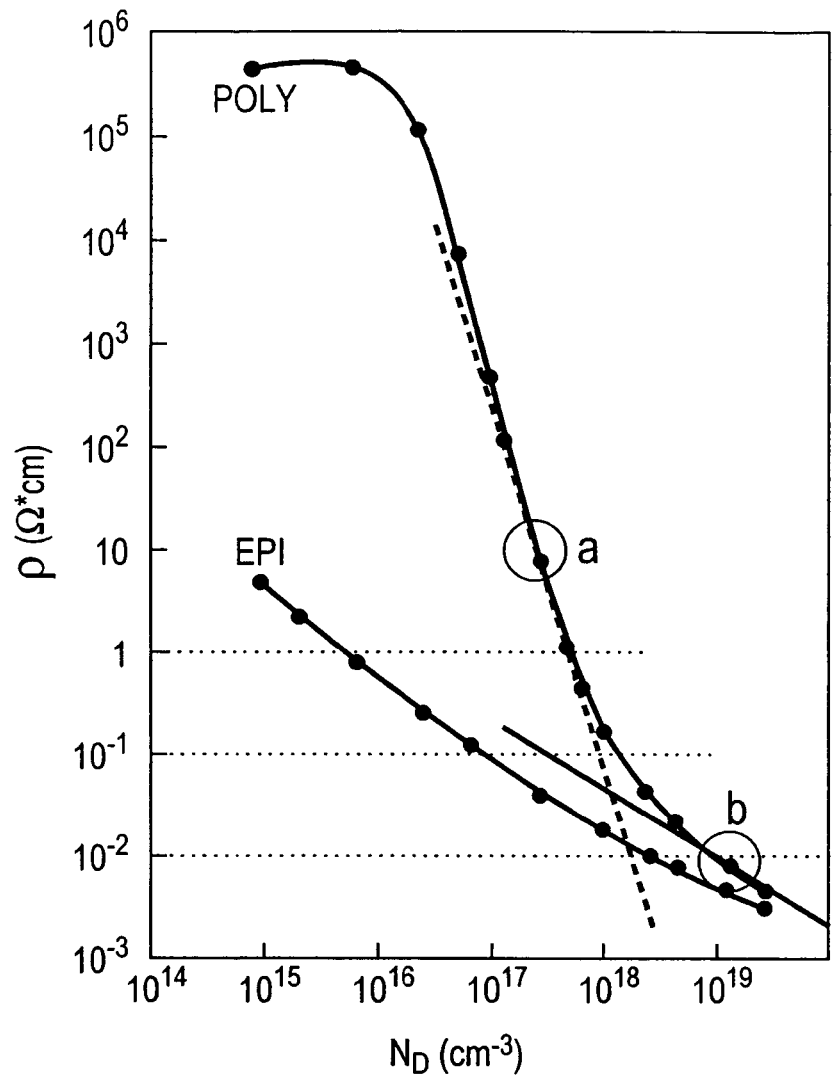
FIG. 1 is a curve of surface resistivity versus doping cocentrations.
Figure 9:
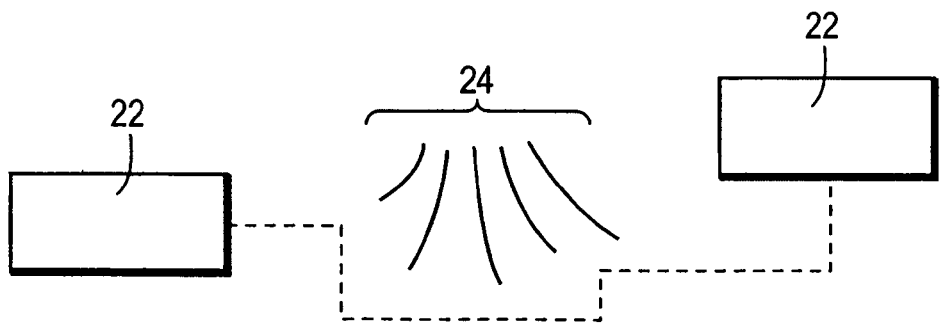
FIG. 9 is a topological view of a resistor with ends 22 and an elongated body incorporating five bends.

FIG. 9 shows a resistor from the top surface where the resistor has five bends 24 or turns along its length from end to end 22.

It should be understood that above-described embodiments are being presented herein as examples and that many variations and alternatives thereof are possible. Accordingly, the present invention should be viewed broadly as being defined only as set forth in the hereinafter appended claims.

The invention claimed is:

1. A process for fabricating a high value polysilicon resistor on a semiconductor wafer, the process comprising the steps of:
    forming at least one oxide layer;
    fabricating a first polysilicon layer on the at least one oxide layer;
    forming an opening in the first polysilicon layer exposing at least one oxide layer, the opening having a periphery defining a vertical edge;
    fabricating a second polysilicon layer of a thickness of about 1000 A entirely covering the surface of the first polysilicon layer, the vertical edge, and any exposed oxide in the etched opening;
    patterning and etching the second polysilicon layer on the exposed oxide and the vertical edge to define the outer edges and length of the high value resistor; the single second polysilicon layer forming the body of the high value resistance,
    patterning and etching the second polysilicon layer on the first polysilicon layer to define ends of the high value resistor, the two layer second and first polysilicon layers so defined forming the two ends of the high value resistance;
    covering the high value resistor and the ends with a dielectric; and
    forming metal contacts reaching through the dielectric to each of the ends thereby making electrical connections to the high value resistor.

2. The process of claim 1 further comprising the steps of forming the resistor as an elongated form of the second polysilicon layer, the elongated form having with more than three and less than ten bends along the length of the resistor.

3. The process of claim 1 further comprising the steps of:
    implanting into the second polysilicon layer, wherein the electrical sheet resistance of the second polysilicon layer alone is in excess of 2000 ohms per square.

4. The process of claim 1 further comprising the step of insitu doping of the second polysilicon layer during an epi deposition process thereby forming a doped second polysilicon layer sheet resistivity in excess of 2000 ohms per square.

5. The process of claim 1 wherein the fabricating of first polysilicon layer is part of epi base BiCMOS process, wherein the first polysilicon layer forms a protection layer for CMOS and other active or passive electrical device structures.

6. The process of claim 1 further comprising the step of an implanting into the ends of the high value resistor to increase the impurity doping level in the ends.

7. The process of claim 1 further comprising the steps of:
    fabricating a self aligned silicide layer on at least one of the ends.

8. The process of claim 7 wherein the silicide layer is composed of a material selected from the group consisting of titanium, tungsten, cobalt, platinum, or like metals well known in the art for silicide layers.

9. The process of claim 1 wherein: the metal contacts are metal plugs.

10. The process of claim 9 wherein the metal plugs are tungsten, copper, aluminum or titanium or combinations thereof.

11. The process of claim 1 wherein the thickness of the second polysilicon layer is less than 1000 A.

* * * * *